United States Patent
Grodzki

(10) Patent No.: US 9,823,326 B2
(45) Date of Patent: Nov. 21, 2017

(54) METHOD AND MAGNETIC RESONANCE APPARATUS TO CORRECT MAGNETIC RESONANCE MEASUREMENT DATA

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 440 days.

(21) Appl. No.: 14/501,591

(22) Filed: Sep. 30, 2014

(65) Prior Publication Data

US 2015/0091568 A1  Apr. 2, 2015

(30) Foreign Application Priority Data

Sep. 30, 2013  (DE) ........................ 10 2013 219 753

(51) Int. Cl.
| | |
|---|---|
| *G01R 33/48* | (2006.01) |
| *G01R 33/565* | (2006.01) |
| *G01R 33/24* | (2006.01) |
| *G01R 33/483* | (2006.01) |

(52) U.S. Cl.
CPC ....... *G01R 33/565* (2013.01); *G01R 33/4822* (2013.01); *G01R 33/4833* (2013.01); *G01R 33/246* (2013.01); *G01R 33/5659* (2013.01)

(58) Field of Classification Search
CPC .............. G01R 33/565; G01R 33/4822; G01R 33/4833; G01R 33/5659
See application file for complete search history.

(56) References Cited

U.S. PATENT DOCUMENTS

| | | | |
|---|---|---|---|
| 2005/0058368 A1* | 3/2005 | Moriguchi | ........... G01R 33/285 |
| | | | 382/280 |
| 2009/0257634 A1 | 10/2009 | Moeller et al. | |
| 2010/0244827 A1 | 9/2010 | Hennel | |

(Continued)

OTHER PUBLICATIONS

Grodzki et al. "Correcting Slice Selectivity in Hard Pulse Sequences," Journal of Magnetic Resonance, vol. 214 (2012) pp. 61-67.

*Primary Examiner* — G. M. Hyder
(74) *Attorney, Agent, or Firm* — Schiff Hardin LLP

(57) ABSTRACT

The method according to the invention for the correction of measurement data acquired along Cartesian lines in k-space, which measurement data have been acquired by means of a pulse sequence in which gradients are switched simultaneously during the radiation of at least one non-selective excitation pulse, includes the steps of measurement data acquired with the pulse sequence are entered into k-space, i.e. entered into a memory organized as k-space, a pulse excitation profile is determined, and the acquired measurement data are corrected using the pulse excitation profile, the correction including a de-convolution operation in at least one of the three k-space directions. The correction of measurement data according to the invention allows an unrestricted use of pulse sequences, in particular gradient echo sequences, in which an excitation is implemented given already activated gradients (for example for noise reduction). A distortion due to superposition of an excitation with a pulse profile can be remedied via the method according to the invention.

10 Claims, 3 Drawing Sheets

(56) References Cited

U.S. PATENT DOCUMENTS

| | | | |
|---|---|---|---|
| 2013/0101198 A1* | 4/2013 | Grodzki | G01R 33/4816 382/131 |
| 2014/0086468 A1* | 3/2014 | Grodzki | G01R 33/56572 382/131 |
| 2014/0167752 A1* | 6/2014 | Hanada | A61B 5/055 324/307 |
| 2014/0232396 A1 | 8/2014 | Grodzki et al. | |

* cited by examiner

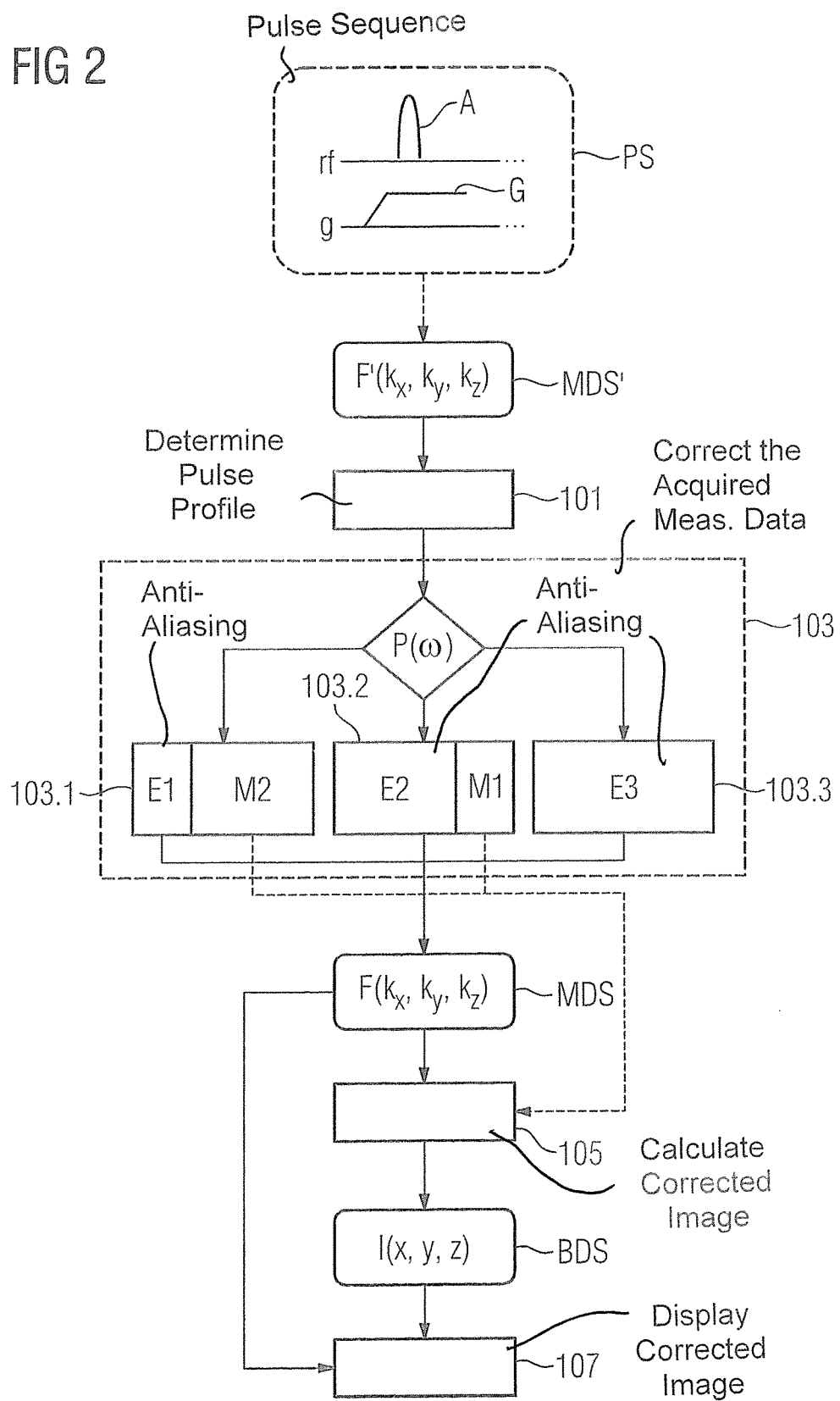

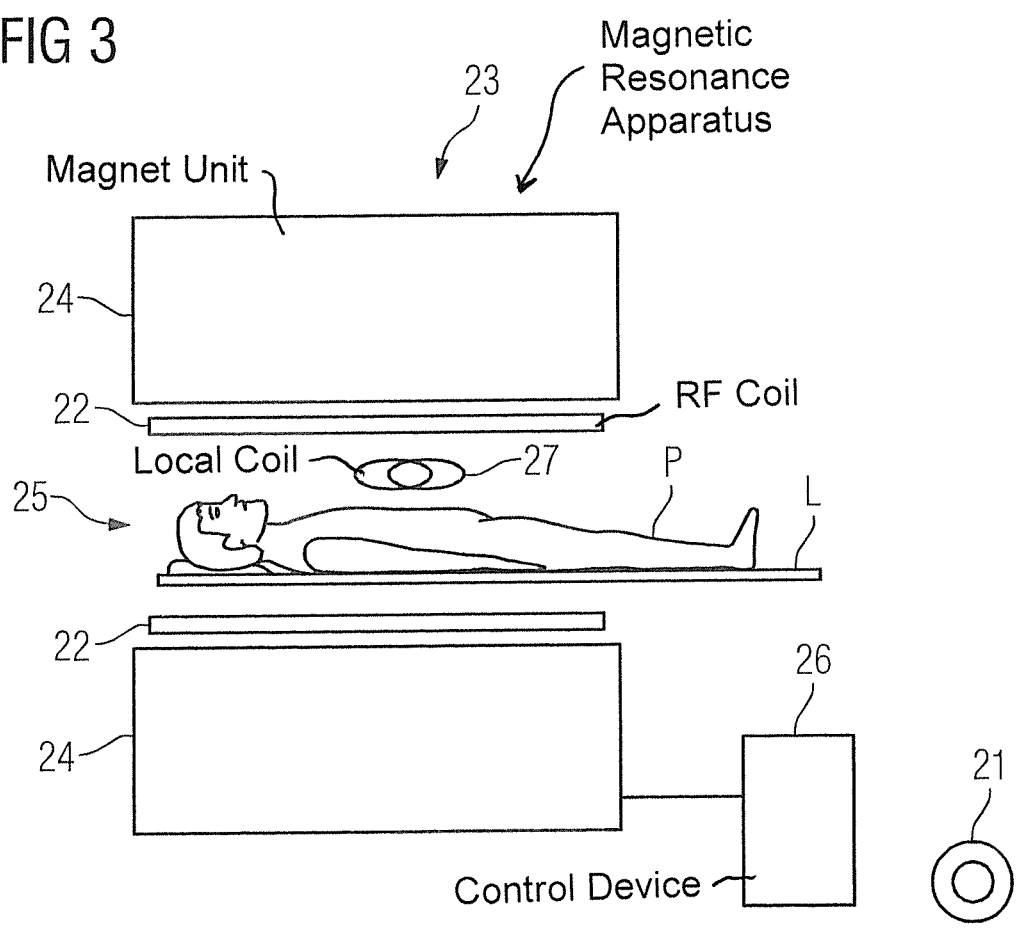

METHOD AND MAGNETIC RESONANCE APPARATUS TO CORRECT MAGNETIC RESONANCE MEASUREMENT DATA

BACKGROUND OF THE INVENTION

Field of the Invention

The invention concerns: the correction of measurement data acquired by magnetic resonance technology, the measurement data having been acquired by operation of a pulse sequence in which gradients are activated simultaneously during the radiation of at least one excitation pulse; and therefore also the correction of artifacts in magnetic resonance images that have been reconstructed from measurement data that have been acquired by an MR pulse sequence in which simultaneous gradients are activated during the radiation of at least one excitation pulse.

Description of the Prior Art

Magnetic resonance (MR) tomography is a known modality with which images of the inside of an examination subject can be generated. Expressed in a simplified manner, the examination subject is positioned in a magnetic resonance apparatus in a strong, static, homogeneous basic magnetic field (also called a $B_0$ field) with a field strength of 0.2 to 7 Tesla or more, such that nuclear spins in the subject orient along the basic magnetic field. To trigger nuclear magnetic resonance, radio-frequency excitation pulses (RF pulses) are radiated into the examination subject, the triggered nuclear magnetic resonances are measured as data are known as k-space data, and on this basis MR images are reconstructed or spectroscopy data are determined. For spatial coding of the measurement data, rapidly switched gradient fields (also simply called gradients for short) are superimposed on the basic magnetic field. The acquired measurement data are digitized and stored as complex numerical values in a memory organized as a k-space matrix. For example, an associated MR image can be reconstructed, by a multidimensional Fourier transformation, for example, from the k-space matrix populated with values.

A known pulse sequence to excite and acquire the nuclear magnetic resonances is the gradient echo sequence, in particular to acquire three-dimensional (3D) data sets. However, such gradient echo-based MR examinations are usually very loud, and therefore are uncomfortable for a patient to be examined. The primary reason for the high noise development is gradient configurations that change rapidly over time and the high slew rates (chronological change of the gradient amplitudes dG/dt associated therewith). Moreover, in the protocol of the sequence, parameters are often necessary that require particularly fast switching of the gradients, for example short echo times or gradient spoiling.

In spite of this, non-selective 3D gradient echo measurements are often used in clinical imaging, but primarily for what are known as preparation measurements. The most important example of such a preparation measurement is the coil sensitivity measurement that is implemented on this patient at least once before the beginning of the actual patient examination if an acquisition coil is used with a sensitivity profile that differs depending on use. During the coil sensitivity measurement, two 3D measurement data sets are acquired, wherein one measurement data set is acquired with what is known as the "body coil" integrated into the magnetic resonance system and the other measurement data set is acquired with the local coil to be used. The sensitivity profile of the local coil, and therefore the intensity distribution of the local coil image, can be calculated on the basis of these two measurement data sets, which includes a division of the two images reconstructed from the respective measurement data sets, and inhomogeneities that arise due to the relative distances from the measurement subject to be examined from the coil element or coil elements of the local coil.

In order to lower the noise volume of such measurements, the maximum gradient performance provided by the sequence can be decreased until the measurement is markedly quieter. However, the minimum echo time thereby increases, the maximum bandwidth possibly decreases, and the repetition time TR of the sequence and the measurement time increase, such that the result of the measurement is not optimal under the circumstances.

In order to reduce the noise development of a gradient echo sequence, for the phase coding and/or pre-dephasing, gradients to be activated are already ramped up before the excitation due to the excitation pulse occurs. More time therefore remains for additional gradients to be activated in the echo time, so these gradients can be activated with reduced slew rate and/or amplitude. However, an unwanted slice selection also occurs by this measure.

In the known PETRA sequence or the known z-TE sequence, the gradients are likewise already activated during the excitation. The spectral profile of the excitation pulse corresponds approximately to a sine function. In the case of insufficient pulse bandwidth or gradients that are too strong, it can also occur that the outer image regions are no longer sufficiently excited by the slice selection that occurs.

In the reconstructed MR image, this incorrect excitation is expressed by smearing artifacts at the image edge, which are more strongly expressed the more strongly that gradients are switched during the excitation.

An insufficient excitation thus leads to artifact-plagued MR images. For the PETRA sequence, from the article by Grodzki et al., "Correcting slice selectivity in hard pulse sequences", Journal of Magnetic Resonance 214, P. 61-67 (2012), or also the US Patent Application US 20130101198 A1, a correction method is known with which such artifacts can be calculated and remedied utilizing the radial symmetry inherent to the PETRA sequence by a matrix inversion. For Cartesian scanning of k-space as is the rule for gradient echo sequences, three-dimensional gradient echo sequences in which k-space is scanned in parallel lines in the readout direction, such a correction is not possible due to the different symmetry.

SUMMARY OF THE INVENTION

An object of the present invention is to enable a correction of artifacts in MR measurements with gradients activated during the excitation, even for an MR measurement that scans (enters data into) k-space line-by-line in a Cartesian manner, without limiting the MR measurement.

The method according to the invention for the correction of measurement data acquired along Cartesian lines in k-space, which measurement data have been acquired by means of a pulse sequence in which gradients are switched simultaneously during the radiation of at least one non-selective excitation pulse, includes the following steps.

Measurement data acquired with the pulse sequence are entered into k-space, i.e. entered into a memory organized as k-space.

A pulse excitation profile is determined.

The acquired measurement data are corrected using the pulse excitation profile, the correction including a de-convolution operation in at least one of the three k-space directions.

The correction of measurement data according to the invention allows an unrestricted use of pulse sequences, in particular gradient echo sequences, in which an excitation is implemented given already activated gradients (for example for noise reduction). A distortion due to superposition of an excitation with a pulse profile can be remedied via the method according to the invention. As described below, this can occur uniformly for the entirety of k-space, or identically per column, or individually for each k-space line.

Artifacts arising due to an excitation with activated gradients can thus be corrected with the method according to the invention.

The invention is based on the following considerations.

In data acquisitions wherein gradients are activated during the excitation of nuclear spins, the excited region changes with each repetition because different gradient configurations are activated in each repetition. This leads to disturbances or disruptions since—for example in the case of a repetition with a gradient configuration of Gx=0 and Gy=G—an image resulting from this measurement point is superimposed with a sinc function which is symmetrical in the y-direction, corresponding to the incorrect excitation. In contrast to which, in the case of a repetition with a gradient configuration of Gx=G and Gy=0, for example, an image resulting from this measurement point is superimposed with a sinc function which is symmetrical in the x-direction, corresponding to the incorrect excitation.

The dependency of the excitation profile in the x-direction (indicated in millimeters "mm"), and therefore the produced excitation P(k,x) (indicated in arbitrary units, "a.U."), on a currently applied gradient strength G1, G2, G3, G4, G5 is presented as an example in FIG. 1. In the shown example, G5>G4>G3>G2>G1. As is apparent, the lower the applied gradient strength, the wider the excitation profile. The widest excitation profile (drawn with continuous line)—i.e. an optimally homogeneous excitation (P(k,x)) over the largest spatial range (x)—is therefore achieved at G1. The narrowest excitation profile (drawn with double dash-dot line)—which already entails a drastic change in the excitation (P(x,k)) is achieved at G5.

As described in the cited article by Grodzki et al., the problem can be described mathematically as follows.

In MR measurements, what is known as k-space F(k) is scanned that corresponds to the examination region to be imaged of the subject to be measured, according to:

$$F(k) = \int f(x) e^{ikx} dx. \quad (1)$$

wherein f(x) is the signal of the subject to be measured. Thereby, k-space F(k) is filled with the acquired measurement data. The image I(x) is calculated by Fourier back-transformation from k-space filled with the measurement data:

$$I(x) = f(x) = \int F(k) e^{-ikx} dk. \quad (2)$$

In the event of insufficient excitation, disturbed or disrupted k-space F'(k) is scanned (i.e. filled with the measurement data) instead of the desired k-space F(k). In disturbed k-space F'(k), the signal of the subject f(x) to be measured is superimposed with a disturbance function P(k,x), which corresponds to the spectral form of the actual excitation pulse (thus the excitation profile):

$$F'(k) = \int f(x) P(k,x) e^{ikx} dx. \quad (3)$$

In the case described in the article by Grodzki et al., the excitation profile P(x,k) depends both on the location x and on the measured k-space point k, and on the gradient strength. The excitation profile of an excitation pulse essentially corresponds to the Fourier transform of the pulse shape of the excitation pulse in the time period p(t); in the example shown using FIG. 1, the excitation profiles each correspond to a sinc function, for example, because they result given "hard", square excitation pulses p(t) that have a constant value (for example B1) that is not equal to zero only during the duration τ of the excitation pulse:

A square excitation pulse $$p(t) = \begin{cases} B1, & \text{for } |t| < \tau/2 \\ 0, & \text{otherwise} \end{cases}$$

corresponds in the frequency domain to a sinc-shaped spectral excitation profile P(ω) with $$P(\omega) = \frac{\sin\left(\frac{1}{2}\omega\tau\right)}{\frac{1}{2}\omega\tau} = \text{sinc}\left(\frac{1}{2}\omega\tau\right) \text{ and a phase factor.}$$

In the presence of switched gradients, the resonance frequency ω is a function of the location (here represented by x) in the image domain, namely ω=2πγωG, with γ being the gyromagnetic ratio and G the strength of the applied gradient. For gradients varying in the course of the MR pulse sequence (for example given different repetitions of the PETRA sequence sequence), ω is also a function of the read-out k-space point k, which is why the excitation profile can be written as P(ω)=P((k,x).

A degraded MR image I'(x) that contains artifacts can be reconstructed from degraded k-space F'(k):

$$I'(x) = \int F'(k) e^{-ikx} dk. \quad (4)$$

In the method described in the cited article by Grodzki et al., the interfering influence of the incorrect excitation pulse is calculated out of the measured measurement data by the excitation error being calculated in a disturbance matrix $D_{kx}$, and the error of the excitation is subsequently remedied by inversion of the disturbance matrix $D_{kx}$.

For this, Equation (3) is written as a sum (actually, discrete measurements are measured) and the disturbance matrix $D_{kx}$ is defined as:

$$D_{kx} = P(k,x) e^{ikx}. \quad (5)$$

The disturbance matrix $D_{kx}$ has N×N elements (wherein N is a natural number), and Equation (3) can be written in matrix form:

$$F'_k = D_{kx} f_x. \quad (6)$$

For PETRA sequences, the disturbance matrix $D_{kx}$ thus reflects an excitation profile of the excitation profile used to acquire the measurement data. The elements of Equation (5) are known from the shape of the excitation pulse, the location to be excited and read-out k-space point k, and the applied gradient G, and can be calculated. Disturbed k-space F'(k) is measured. The undisturbed image I(x) can therefore be calculated by matrix inversion of $D_{kx}$ and matrix multiplication with disturbed k-space:

$$f_x = I_x = D_{kx}^{-1} F'_k. \quad (7)$$

In contrast to this, for gradient echo sequences with line by line scanning disturbed k-space $F'(k_x,k_y,k_z)$ is measured in parallel k-space lines (in sum notation):

$$F'(k_x,k_y,k_z)=\Sigma_{x,y,z}f(x,y,z)P(\omega)e^{i(x*kx+y*ky+z*kz)}. \quad (3)'$$

In contrast to the case described in the aforementioned article by Grodzki et al.—in which the excitation pulse $P(\omega)$ can be expressed as a function of the k-space and spatial domain point $P(\omega)=P(k,x)$—the excitation pulse $P(\omega)$ in accordance with the invention depends on a location x, y, z and on $k_y$, $k_z$—but not on $k_x$—given line-by-line scanning of k-space with slice selection in the x-direction, since the disturbance is the same for each acquired line in the readout direction. Here, $P(\omega)=P(ky,kz,x,y,z)$ Without limitation as to generality, the x-direction ($k_x$-direction) is defined as the readout direction and the y-direction ($k_y$-direction) and the z-direction ($k_z$-direction) are defined as the phase coding directions.

For three-dimensional k-space, "lines" in the readout direction and "columns" or "partitions" in the phase coding directions are considered.

The disturbance or disordering $(k_y,k_z,x,y,z)$ for an individual acquired k-space line therefore corresponds to a simple aliasing, as is apparent by rewriting Formula (3)' and considering the range within the square brackets:

$$F'(k_x,k_y,k_z)=\Sigma_{yz}[\Sigma_x f(x,y,z)P(ky,kz,x,y,z)e^{i(x*kx+y*ky+z*kz)}]. \quad (3)''$$

For each acquired k-space line, the aliasing can now be remedied via a Fourier transformation back into image space, a division by the pulse profile $P(x)$ (y, $k_y$, z and k, are known for each k-space line), and subsequent Fourier transformation again back into k-space. All image space points are traversed in the division. The division factor depends only on the x-value, but not on the y-value and z-value of the corresponding image space point. x corresponds to the x-value of the image space point. Disturbed k-space $F'(x)$ is thus corrected into undisturbed k-space $F(x)$. The correction of an aliasing in the readout direction x is thus sufficient in order to correct the disturbance:

$$F(x,y,z)=F'(x,y,z)/P(x). \quad (8)$$

In the phase coding directions $k_y$ (y) and $k_z$ (z), the disturbance is generally more complex but can be corrected with matrix inversion, analogous to the names in the cited article by Grodzki et al. If a simple Fourier transformation were to be applied in the phase coding directions given arbitrary gradients, errors would arise in the image, as is likewise described in the cited article by Grodzki et al. In the phase coding directions, the equation can thus be rewritten in matrix equations. These matrices can be inverted and the influence of the distortion can thus be corrected.

In general, given arbitrary gradient strengths, the disturbance can thus be remedied via a de-convolution in the readout direction and matrix inversions in the phase coding directions, wherein the definition of the matrices required for this can be implemented analogous to the case described in the cited article by Grodzki et al.:

$$D_{k_yk_zyz}=P(ky,kz,y,z)e^{i(y*ky+z*kz)}. \quad (9)$$

In this way, arbitrary gradient strengths can be used for each repetition during the excitation. However, the inversion matrices must be recalculated for each line, which can be time-consuming and overall can lead to reconstruction times of multiple seconds.

In order to circumvent the necessity of matrix inversions, and thus again to save computing time, appropriate boundary conditions can be placed on the activated gradients. This means that the degrees of freedom of the gradients are limited, for example in that only constant (absolute) gradient amplitudes are used in one of the phase coding directions (for example $k_y$). The pulse profile $P(\omega)$ thereby loses the dependency on $k_y$. It applies that: $P(\omega)=P(x,y,z,k_z)$. In this case, a matrix inversion is still to be implemented only in the $k_z$-direction in this case. Analogous to the $k_x$-direction, a de-convolution can be applied in the $k_y$-direction:

$$F(x,y,z)=F'(x,y,z)/P(x,y). \quad (10)$$

Furthermore, the degrees of freedom of the gradients to be activated can be limited further in that constant (absolute) gradient amplitudes are used in each spatial direction over the entire acquisition. In the above formula, the pulse profile $P(\omega)$ thereby also still loses the dependency on $k_z$. Thus $P(\omega)=P(x,y,z)$. The entire problem can therefore be expressed as a de-convolution and can be corrected by division in image space, for example:

$$F(x,y,z)=F'(x,y,z)/P(x,y,z). \quad (11)$$

A magnetic resonance system according to the invention comprises a control device designed to implement a method according to the invention.

The invention also encompasses a non-transitory, computer-readable data storage medium encoded with programming instructions that, when the storage medium is loaded into a control and processing computer of a magnetic resonance apparatus, cause the control and processing computer to operate the magnetic resonance apparatus to implement the method according to the invention, as described above.

The advantages and embodiments described with regard to the method analogously apply to the magnetic resonance system and the electronically readable data medium.

BRIEF DESCRIPTION OF THE DRAWINGS

FIG. 2 is a flowchart of an embodiment of the method according to the invention.

FIG. 3 schematically illustrates a magnetic resonance system according to the invention.

DESCRIPTION OF THE PREFERRED EMBODIMENTS

Figure 1:
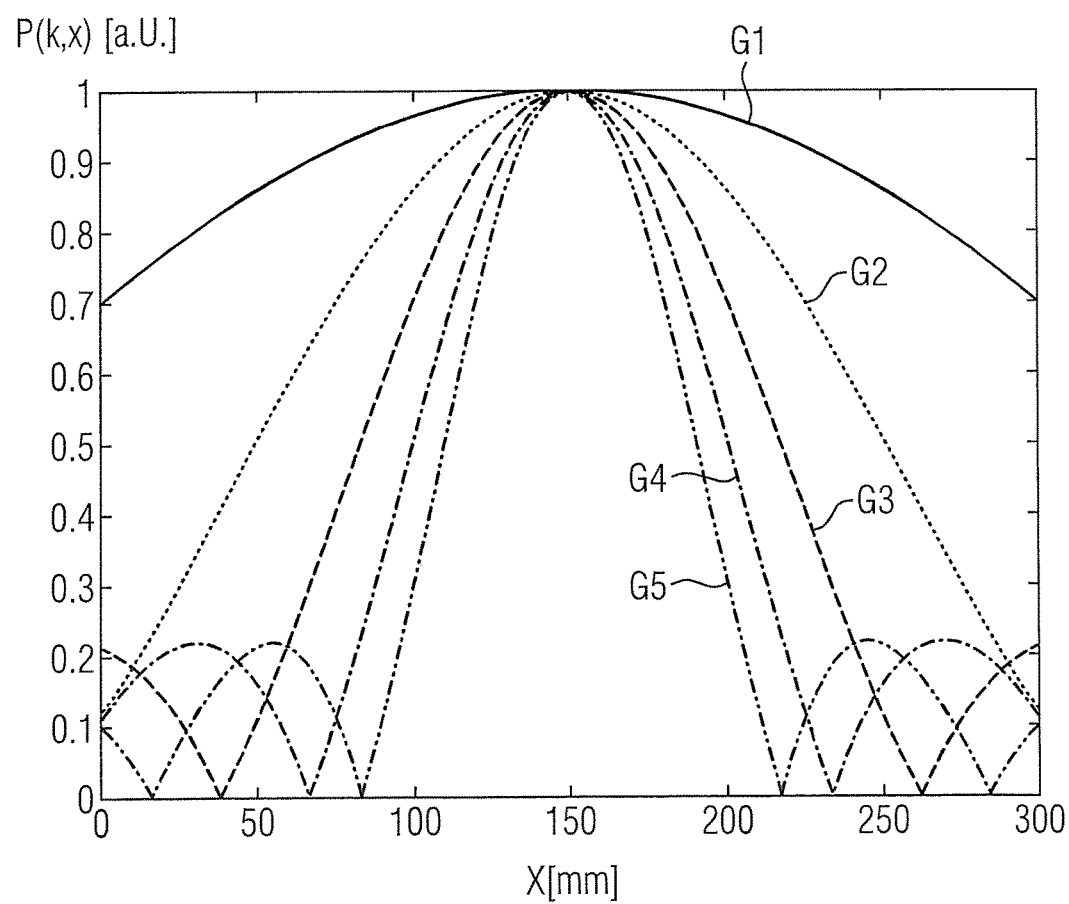
FIG. 1 depicts the influence of the applied gradient strength on the excitation profile of an excitation pulse.

FIG. 2 is a schematic flowchart of an embodiment of the method according to the invention. Measurement data MDS' that are acquired by means of a pulse sequence PS (in which gradients G are activated simultaneously during the radiation of at least one non-selective excitation pulse A) along Cartesian lines in k-space (in particular in the $k_x$-direction as a readout direction) are initially loaded into a computer, for example a control unit of a magnetic resonance system. Due to the superposition of the excitation pulse A with the simultaneously switched gradients G, the acquired measurement data MDS' are located in distorted k-space $F'(k_x,k_y,k_z)$.

In a step 101, a pulse profile $P(\omega)$ of an excitation pulse A used by the pulse sequence PS is determined. As already noted, the excitation profile $P(\omega)$ of an excitation pulse A corresponds essentially to the Fourier transformation of the pulse shape of the excitation pulse A in time period p(t). For example, square excitation pulses A are used in the pulse sequence PS, whereby these can be kept especially short, and thus a reduction of the noise development caused by the pulse sequence PS can be achieved.

The acquired measurement data MDS' can be corrected in a step 103 using the defined pulse excitation profile P(ω) as described above, wherein the correction includes a de-convolution operation E1, E2, E3 in at least one of the three k-space directions ($k_x$, $k_y$, $k_z$). The de-convolution operation E1, E2, E3 includes a Fourier transformation of the measured measurement data (MDS') in the image space, a division by the defined pulse excitation profile (P(ω)), and a Fourier transformation back into k-space.

The k-space directions in which the de-convolution operation E1, E2, E3 is implemented given correction of the measurement data MDS' are determined under consideration of the gradients G to be switched in the pulse sequence. Depending on the gradients G to be switched, the pulse excitation profile (P(ω)) is dependent or not on the k-space directions in which a phase coding occurs.

If the pulse excitation profile P(ω) is dependent on a k-space direction $k_x$, $k_y$, $k_z$, the correction for the entirety of k-space can be implemented uniformly by means of a described de-convolution operation E3 in all three spatial directions of k-space (Block 103.3). A corrected image (BDS) can now be calculated (Block 105) and/or displayed (Block 107) from the measurement data (MDS) corrected in this way.

If the pulse excitation profile P(ω) is dependent on only one k-space direction $k_x$, $k_y$, $k_z$, the correction can be implemented per column by means of the de-convolution operation E2 (described above) in the two k-space directions which P(ω) is independent of (Block 103.2).

If the pulse excitation profile P(ω) is dependent on two k-space directions $k_x$, $k_y$, $k_z$, the correction can be implemented per line by means of the de-convolution operation E1 (described above) in the k-space direction which P(ω) is independent of (Block 103.1).

Given a line-by-line scanning of k-space in the readout direction, due to the constant gradient in the readout direction the pulse excitation profile P(ω) is not dependent on the readout direction, and a de-convolution operation E1, E2, E3 can be implemented in each case in the readout direction ($k_x$).

For k-space directions in which no de-convolution operation E1, E2, E3 is implemented, as likewise described above, a disturbance matrix is determined and inverted (Block 103.1 and 103.2) on the basis of spatial and k-space point data of the acquired measurement data (MDS') and the gradient G used during the excitation. This can now be used in order to calculate the measurement data MDS corrected by means of a de-convolution operation E1, E2 and a corrected (with regard to one or, respectively, two k-space directions, as described above) image BDS via the implemented matrix inversion M1, M2 (Block 105), and to display or store this (Block 107).

In order to enable a fast and optimally complete correction of the measurement data MDS', the pulse sequence used to acquire the measurement data MDS' can be selected such that the degrees of freedom of the gradients to be switched are limited in at least one phase coding direction such that constant (absolute) phase coding gradients are used.

Experiences with the method described in the cited article by Grodzki et al. show that the disturbances can be very stably and reliably remedied as long as the first minimum of the sinc profile of the pulse lies outside of the examination subject to be examined, since otherwise the noise level is too strongly elevated. In order to avoid this, the maximum absolute gradient strength can be limited such that it does not exceed a value that is provided by the first minimum of the sinc profile. Given an excitation pulse with a duration of 14 microseconds and an FOV ("field of view") of 200 mm, this maximum strength of the absolute gradient amounts to approximately 10 mT/m, and therefore is well beyond the value that would be required in most cases for three-dimensional gradient echo sequences, in particular for determining sensitivity profiles, which is why no limitations are to be expected here.

FIG. 3 is a schematic illustration of a magnetic resonance apparatus 23 according to the invention. As is basically known, this has a basic magnet unit 24 that defines a patient receptacle 25 that can be surrounded by a radio-frequency coil arrangement (in particular a body coil 22) and a gradient coil arrangement. In particular, a patient P or another examination subject to be examined, on a patient bed L, can be introduced into the patient receptacle 25 in the magnetic resonance system 23. Furthermore, the magnetic resonance apparatus 23 can have at least one transportable radio-frequency coil arrangement (a local coil 27) that can additionally be variably introduced into the patient receptacle. For example, the local coil 27 can comprise at least two individual coils, each with an acquisition channel. The operation of the magnetic resonance apparatus 23 is controlled by a control device 26 that is designed to implement the method according to the invention, thus in particular to correct measurement data and artifacts in image data as has been described.

For example, the method according to the invention is implemented by a computer program according to the invention at a control device 26 of the magnetic resonance apparatus 23 when it is executed at the control device 26. The control device 26 is therefore designed to be able to implement a method according to the invention. For this, an electronically readable data medium 21 with electronically readable control information stored thereon is loaded into the control device 26. The control information includes at least one such computer program and is designed such to cause the control device 26 to operate the magnetic resonance apparatus 23 so as to implement the method according to the invention for the correction of artifacts as described above.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting magnetic resonance (MR) measurement data, comprising:

entering MR measurement data along respective Cartesian lines in an electronic memory organized as k-space, wherein k-space in said memory comprises three orthogonal Cartesian directions, said MR measurement data having been acquired by operating an MR apparatus with a pulse sequence in which gradients are activated simultaneously during radiation of at least one non-selective excitation pulse;

determining a pulse excitation profile of said excitation pulse; and in a computer provided with said pulse excitation profile and having access to said memory, correcting said acquired measurement data in k-space using said pulse excitation profile by executing a de-convolution operation in at least one of said three orthogonal directions in k-space.

2. A method as claimed in claim 1 comprising, for any of said directions in k-space for which said de-convolution algorithm is not implemented, determining, in said computer, a disturbance matrix based on spatial domain point data and k-space point data of said MR measurement data along said k-space directions in which no de-convolution algorithm is implemented, and the gradients used to acquire said MR measurement data.

3. A method as claimed in claim 2 comprising, in said computer, calculating corrected image data from the MR image data corrected using said de-convolution algorithm, and from said MR measurement data in directions not corrected by said de-convolution algorithm by calculating an error from an inversion of said disturbance matrix.

4. A method as claimed in claim 1 wherein said MR image data are corrected in all of said k-space directions using said de-convolution algorithm, and generating a corrected image from the corrected MR measurement data that were corrected using said de-convolution algorithm.

5. A method as claimed in claim 1 comprising executing said de-convolution algorithm in a readout direction of k-space.

6. A method as claimed in claim 1 comprising determining directions in k-space for which said de-convolution algorithm is implemented dependent on the gradients activated in said pulse sequence.

7. A method as claimed in claim 1 comprising, in said pulse sequence, limiting degrees of freedom of the activated gradients in at least one phase coding direction of k-space, in order to form constant phase coding gradients.

8. A method as claimed in claim 1 comprising, in said de-convolution algorithm, implementing a Fourier transformation of the MR measurement data in k-space, to obtain transformed data, dividing the transformed data by said pulse excitation profile to obtain a quotient, and Fourier transforming said quotient back into k-space.

9. A magnetic resonance (MR) apparatus comprising:
- an MR data acquisition unit comprising a gradient system and a radio-frequency (RF) system;
- a control unit configured to operate said MR data acquisition unit with a pulse sequence in which gradients are activated simultaneously, by said gradient system, during radiation of at least one non-selective RF excitation pulse by said RF system;
- an electronic memory organized as k-space with data entry points along three orthogonal Cartesian directions in k-space;
- said control unit being configured to enter said MR measurement data along respective Cartesian lines in k-space in said memory; and
- said computer being provided with a pulse excitation profile of said RF excitation pulse, and being configured to correct said acquired measurement data in k-space using said pulse excitation profile by executing a de-convolution operation in at least one of said three orthogonal directions in k-space.

10. A non-transitory, computer-readable data storage medium encoded with programming instructions, said storage medium being loaded into a control and processing computer of a magnetic resonance (MR) apparatus, and said programming instructions causing said control and processing computer to:
- enter MR measurement data along respective Cartesian lines in an electronic memory organized as k-space, wherein k-space in said memory comprises three orthogonal Cartesian directions, said MR measurement data having been acquired by operating an MR apparatus with a pulse sequence in which gradients are activated simultaneously during radiation of at least one non-selective excitation pulse; and
- use a pulse excitation profile of said excitation pulse provided to said computer to correct said acquired measurement data in k-space by executing a de-convolution operation in at least one of said three orthogonal directions in k-space.

* * * * *